(12) United States Patent
Frougier et al.

(10) Patent No.: US 12,317,509 B2
(45) Date of Patent: May 27, 2025

(54) STACKED SPIN-ORBIT-TORQUE MAGNETORESISTIVE RANDOM-ACCESS MEMORY

(71) Applicant: International Business Machines Corporation, Armonk, NY (US)

(72) Inventors: Julien Frougier, Albany, NY (US); Kangguo Cheng, Schenectady, NY (US); Dimitri Houssameddine, Sunnyvale, CA (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 874 days.

(21) Appl. No.: 17/393,938

(22) Filed: Aug. 4, 2021

(65) Prior Publication Data

US 2023/0040768 A1 Feb. 9, 2023

(51) Int. Cl.
*H10B 61/00* (2023.01)
*G11C 11/16* (2006.01)
*H10N 52/00* (2023.01)
*H10N 52/01* (2023.01)
*H10N 52/80* (2023.01)
*H01F 10/32* (2006.01)

(52) U.S. Cl.
CPC ............ *H10B 61/20* (2023.02); *G11C 11/161* (2013.01); *H10N 52/01* (2023.02); *H10N 52/101* (2023.02); *H10N 52/80* (2023.02); *G11C 11/1673* (2013.01); *G11C 11/1675* (2013.01); *H01F 10/3286* (2013.01); *H01F 10/329* (2013.01)

(58) Field of Classification Search
CPC ........ H10B 61/20; H10N 52/01; H10N 52/80; H10N 52/101; G11C 11/161; G11C 11/1673; G11C 11/1675
USPC ........................................................ 257/421
See application file for complete search history.

(56) References Cited

U.S. PATENT DOCUMENTS

| 6,925,000 B2 | 8/2005 | Sussner |
| 7,042,749 B2 | 5/2006 | Nejad |
| 7,330,367 B2 | 2/2008 | Nejad |
| 7,339,811 B2 | 3/2008 | Nejad |
| 7,339,812 B2 | 3/2008 | Nejad |

(Continued)

FOREIGN PATENT DOCUMENTS

| JP | 3887272 B2 | 2/2007 |
| WO | 2017052542 A1 | 3/2017 |

OTHER PUBLICATIONS

Cao et al., "Prospect of Spin-Orbitronic Devices and Their Applications", 2020, IScience, 22 pps., 101614.
Liu et al., "Field-free Magnetization Switching by Utilizing the Spin Hall Effect and Interlayer Exchange Coupling of Iridium. Scientific reports", 2019, 9(1), 1-7.
Seo et al., "Area Optimization Techniques for High-Density Spin-Orbit Torque MRAMs", 2021, Electronics, 10(7), 792, 11 pps.

(Continued)

*Primary Examiner* — Jami Valentine Miller
(74) *Attorney, Agent, or Firm* — David K. Mattheis

(57) ABSTRACT

A spin-orbit torque magnetoresistive random-access memory device formed by fabricating a plurality of stacks of vertical magnetoresistive random-access memory (MRAM) cell stacks, each stack formed upon a different bottom electrode, each stack including: a first vertical MRAM cell stack, the first vertical MRAM cell stack disposed upon a first bottom electrode, a first metal layer disposed above and in electrical contact with the first MRAM cell stack, and a second vertical MRAM cell stack, the second MRAM cell stack disposed above and in electrical contact with the first metal layer. Further by fabricating a low resistivity layer between adjacent stacks of vertical MRAM cell stacks, the low resistivity layer in electrical contact with the spin-Hall-Effect layer of each of the adjacent stacks.

14 Claims, 12 Drawing Sheets

(56) References Cited

U.S. PATENT DOCUMENTS

| | | | |
|---|---|---|---|
| 8,451,642 | B2 | 5/2013 | Seyyedy |
| 8,963,222 | B2 | 2/2015 | Guo |
| 9,620,188 | B2 | 4/2017 | Manipatruni |
| 9,768,229 | B2 | 9/2017 | Braganca |
| 9,830,966 | B2 | 11/2017 | Mihajlovic |
| 9,837,602 | B2 | 12/2017 | Braganca |
| 10,381,060 | B2 | 8/2019 | Kan |
| 2005/0087786 | A1 | 4/2005 | Asao |
| 2006/0033136 | A1* | 2/2006 | Liu .................. H10N 50/01 257/E27.005 |
| 2017/0365777 | A1 | 12/2017 | Mihajlovic |
| 2021/0257543 | A1* | 8/2021 | Wu .................. H10N 50/85 |

OTHER PUBLICATIONS

Berger et al. "Determination of Spin Hall Effect and Spin Diffusion Length of Pt From Self-consistent Fitting of Damping Enhancement and Inverse Spin-orbit Torque Measurements", Condensed Matter > Mesoscale and Nanoscale Physics, Nov. 2017, 22 pages, vol. 98, Issue No. 2.

Karwacki et al. "Optimization of Spin Hall Magnetoresistance in Heavy-metal/ferromagnetic-metal Bilayers", Scientific Reports, Jul. 1, 2020, 8 pages, vol. 1, Issue No. 1.

Zhang et al. "Determination of the Pt Spin Diffusion Length by Spin-pumping and Spin Hall Effect", Applied Physics Letter, Dec. 12, 2013, 7 pages, vol. 103.

Peng et al., "Field-Free Switching of Perpendicular Magnetization through Voltage-Gated Spin-Orbit Torque", Physical Review Journal, Mar. 23, 2021, 04 pages.

* cited by examiner

STACKED SPIN-ORBIT-TORQUE MAGNETORESISTIVE RANDOM-ACCESS MEMORY

BACKGROUND

The disclosure relates generally to stacked magnetoresistive random-access memory (MRAM). The disclosure relates particularly to stacked spin-orbit torque MRAM structures including a shared low resistivity spin-Hall-effect (SHE) rail.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, (the P state) the MTJ is in a low resistance state. Conversely, when the magnetization direction of the free layer is antiparallel to the magnetization direction of the fixed layer, (the AP state) the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be formed as a vertical stack enabling device design options for increasing device memory cell element density while maintaining or even reducing the scale of devices.

Spin-orbit-torque (SOT) MRAM cells include a spin-orbit torque, or spin-Hall-effect (SHE), layer in contact with the magnetic tunnel junction (MTJ) structure of the MRAM. The SHE is typically a heavy conductive metal, such as platinum or tantalum. Current is passed through the SHE layer, but not through the MTJ structure, to write to the cell and current is passed through the MTJ to read the cell. Since high voltage write energies are not passed though the MTJ of the MRAM cell, SOT-MRAM tend to be more reliable and have a longer lifecycle. Less energy is used in writing the SOT-MRAM, as the write energy does not pass through the MTJ. Passing the write current through the SHE layer, and not through the MTJ structure, also yields fewer writing errors, and higher writing speeds—further reducing the energy needed per write operation. SOT-MRAM densities may be increased by integrating multiple SOT-MRAM cells on a common SHE layer, sharing the SOT-MRAM driving transistors across multiple cells.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a spin-orbit torque magnetoresistive random-access memory device formed by fabricating a plurality of stacks of vertical magnetoresistive random-access memory (MRAM) cell stacks, each stack formed upon a different bottom electrode, each stack including: a first vertical MRAM cell stack, the first vertical MRAM cell stack disposed upon a first bottom electrode, a first metal layer disposed above and in electrical contact with the first MRAM cell stack, and a second vertical MRAM cell stack, the second MRAM cell stack disposed above and in electrical contact with the first metal layer. Further by fabricating a low resistivity layer between adjacent stacks of vertical MRAM cell stacks, the low resistivity layer in electrical contact with the spin-Hall-Effect layer of each of the adjacent stacks.

In one aspect, a spin-orbit torque magnetoresistive random-access memory device includes a first vertical MRAM stack disposed upon a bottom electrode, a spin-Hall-effect (SHE) rail disposed above and in electrical contact with the first MRAM stack, and a second vertical MRAM stack disposed above and in electrical contact with the SHE rail. The SHE rail includes a first SHE material disposed between the first vertical MRAM stack and the second MRAM stack, and a second material disposed between and in electrical contact with the SHE material of adjacent stacks of vertical MRAM stacks.

In one aspect, a spin-orbit torque magnetoresistive random-access memory device includes a plurality of first vertical MRAM stacks, each stack disposed upon a different bottom electrode, the bottom electrode in electrical communication with a semiconductor device transistor, a spin-Hall-effect (SHE) rail disposed above and in electrical contact with the first MRAM stack, and a second vertical MRAM stack disposed above and in electrical contact with the SHE rail. The SHE rail includes a first SHE material disposed between the first vertical MRAM stack and the second MRAM stack, and a second material disposed between and in electrical contact with the SHE material of adjacent stacks of vertical MRAM stacks.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
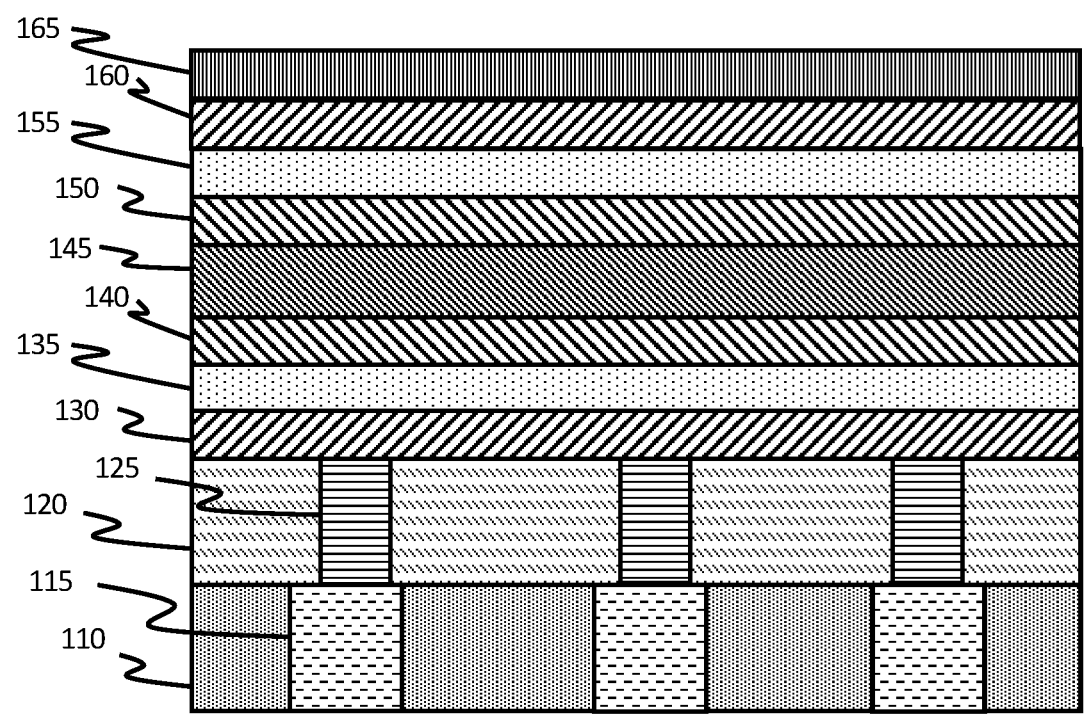
FIG. 1 provides a cross-sectional view of a step in the fabrication of a semiconductor device, according to an embodiment of the invention. The figure illustrates a stack of MRAM layers deposited upon an underlying semiconductor device.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Spin-transfer torque (STT) magnetoresistive random-access memory (MRAM) pass current through the magnetic tunnel, junction of the memory cell during each of read and write operations. High write energies can reduce the longevity of the devices by degrading the device materials. Spin-orbit torque (SOT) MRAM devices resolve this issue by only passing relatively low read operation energies directly through the magnetic tunnel junction of the MRAM cell. The SOT, or spin Hall-effect (SHE) plate of the SOT-MRAM cell must have a cross sectional area equal to or greater than the rest of the MRAM cell stack to effectively alter the free layer and write to the cell. Writing to a SOT-MRAM cell does not require passing energy through the SOT-MRAM cell stack. Integrating multiple SOT-MRAM cells using a common SHE write line improves MRAM cell density.

Integrating multiple MRAM cells on the same SHE Write Line requires increasing the overall length of the line between the 2 driving transistors. SHE Write lines need to be formed using heavy metal (W, Pt, AuW, etc.) exhibiting strong spin-orbit interaction and Spin-Hall-Effect properties for the SOT-MRAM to be functional. These metals have higher resistivity than standard middle-of-line, back-end-of-line metals such as Cu. This can lead to a significant increase of the overall SHE write line resistivity and an increase of the average power consumption/unit cell. This can also lead to a degradation of the Bitcell TMR (tunnel magnetoresistance or Read margin) by adding a more significant parasitic resistance in series with the intrinsic MTJ TMR.

Ion beam etching (IBE) during the formation of the SOT-MRAM stack can cause back sputtering of material from a lower SOT layer, damaging the final MRAM stack and reducing the reliability of the device. Stacking SOT-MRAM cells to increase device cell density offer additional opportunities for detrimental back sputtering to occur during fabrication of the stacked SOT-MRAM cell elements.

The disclosed inventions include devices and methods to fabricate stacked MRAM cell elements having a common SHE rail without detrimental back sputtering through the late formation of the common SHE rail between MRAM cell stacks. Such methods provide higher device densities as the MRAM cell elements share a common footprint, reducing the cost per unit of storage, simplify circuit design by sharing a SHE write line for upper and lower SOT-MRAM cells, and enable use of the SOT-MRAM cells in Neural Network applications as artificial synapse to store node weight using multiple resistance weights.

In an embodiment, multiple stacks, each stack including a pair of vertical SOT-MRAM cell stacks, are etched from material layers deposited upon an underlying semiconductor device. As shown in FIG. 1, device 100 includes a succession of layers, 130-165, deposited upon the dielectric material 120 and multiple bottom electrodes 125. Dielectric material 120 is deposited and bottom electrodes 125 are formed upon underlying semiconductor device including dielectric material 110 and underlying device transistor contacts 115. The deposited layers are etched to form the vertical magnetic—tunnel junction (MTJ) stacks of the pairs SOT-MRAM cells.

In the illustrated embodiment, the layers of the stacks include simplistically depicted layers for upper/lower pairs of MTJ. The lower MTJ including a lower reference magnetic layer 130 (a layer having a fixed magnetic dipole moment), a lower tunnel barrier layer 135, and a lower free magnetic layer 140 (a layer having a switchable magnetic dipole moment). Similarly, the upper MTJ includes an upper free magnetic layer 150 (a layer having a switchable magnetic dipole moment), an upper tunnel barrier layer 155, and an upper reference magnetic layer 160 (a layer having a fixed magnetic dipole moment).

The lower reference layer 130, may include, for example one or more interfacial layers, or spacers, and ruthenium, cobalt, palladium, tantalum, iron, boron, cobalt-platinum (Co|Pt) or cobalt-palladium (Co|Pd), in multilayers or a mixture. In an embodiment, reference layer 130 is between about 3 nm and about 10 nm in thickness. Next, the lower tunnel barrier layers 135, is formed. Lower tunnel barrier layer 135, may include a non-magnetic insulating material such as magnesium oxide (MgO). In an embodiment, lower tunnel barrier layer 135, is between about 1 nm and about 3 nm in thickness. Following the formation of the lower tunnel barrier layer 135, the free layer 140 is formed on top of the lower tunnel barrier layer 135. In this embodiment, the lower MTJ includes a seed layer (not shown) having free layer 140 grown thereon. The seed layer may include, for example, tantalum (Ta) or tantalum magnesium (TaMg) in some embodiments. The free layer 140 may include cobalt-iron-boron (CoFeB), for example. The respective layers may be formed by PVD. The free layer 140 and the reference layer 130 have perpendicular magnetic anisotropy.

In an embodiment, the layers of the lower and upper MRAM cell stacks are separated by an SHE layer 145 deposited upon lower free layer 140. In an embodiment, SHE layer 145 consists of a heavy, conductive metal such as platinum, palladium, tungsten, cobalt, tantalum, or similar conductive metals. In an embodiment, the SHE layer 145 has a thickness of between about 10 nm and about 50 nm. In an embodiment, SHE layer 145 consists of $Bi_2Se_3$. Deposition of the SHE layer 145 occurs by deposition processes including, e.g., chemical vapor deposition (CVD), physical vapor deposition (PVD), atomic layer deposition (ALD), or similar processes.

The upper SOT-MRAM cell stack layers deposited above the SHE layer 145 include an upper free magnetic layer 150 (a layer having a switchable magnetic dipole moment), an upper tunnel barrier layer 155, an upper fixed magnetic layer 160 (a layer having a fixed magnetic dipole moment) and an upper contact electrode layer 165. In this embodiment, the upper SOT-MRAM cell stack layers includes a seed layer (not shown) having free magnetic layer 150 grown thereon. The seed layer may include, for example, tantalum (Ta) or tantalum magnesium (TaMg) in some embodiments. The upper free magnetic layer 150 may include cobalt-iron-boron (CoFeB), for example. Next, the upper tunnel barrier layer 155 is formed on the upper free magnetic layer 150. The upper tunnel barrier layer 155 may include a non-magnetic insulating material such as magnesium oxide (MgO). Following the formation of the upper tunnel barrier layer 155, an upper fixed layer 160 is formed on top of the upper tunnel barrier layer 155. The upper fixed layer 160 may include, for example, one or more interfacial layers, or spacers, and cobalt-platinum (Co|Pt) or cobalt-palladium (Co|Pd), in multiple layers or a mixture, in various embodiments. The upper contact electrode layer 165 includes a conductive material such as a metal. The respective layers may be formed by radio-frequency sputtering. The upper free magnetic layer 155 and the upper fixed layer 160 have perpendicular magnetic anisotropy.

In an embodiment, the SOT-MRAM cell stacks including the lower MRAM stack, SHE layer, and upper MRAM stack, are formed using a patterning and etching process such as reactive ion etching (RIE) or Ion Beam Etching (IBE) or a combination of both.

Figure 2:
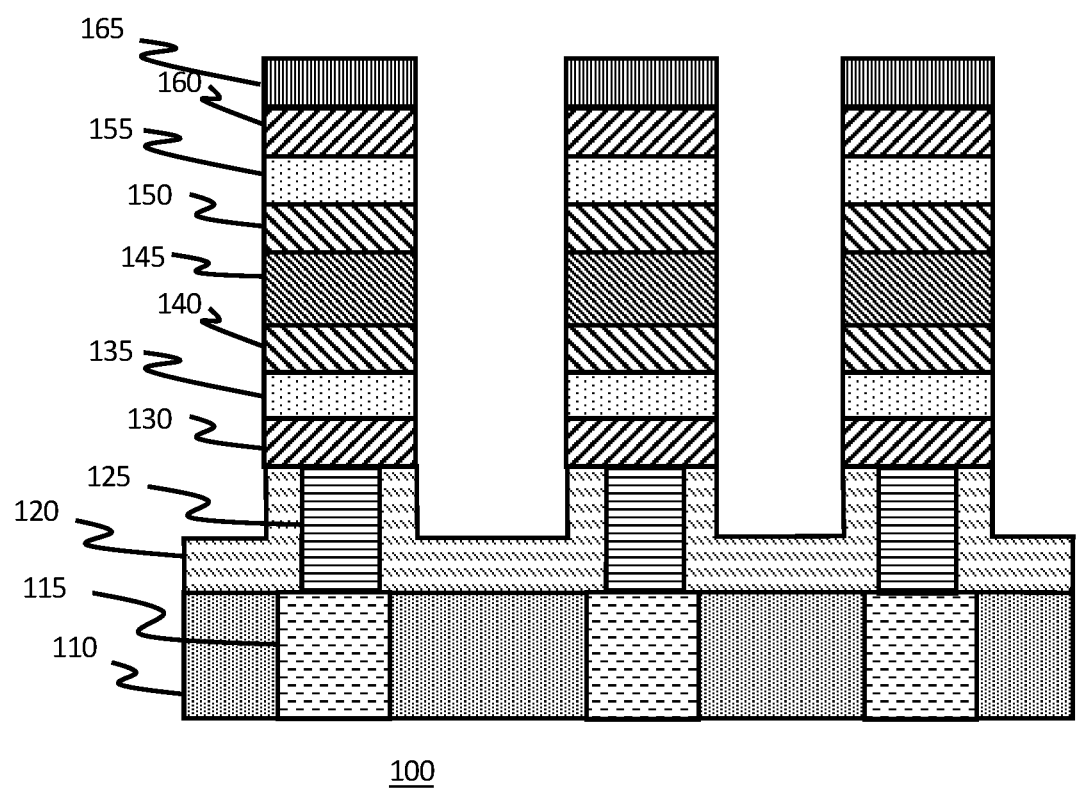
FIG. 2 provides a cross-sectional view of a step in the fabrication of a semiconductor device, according to an embodiment of the invention. The figure illustrates a plurality of MRAM cell stacks etched from the MRAM layers.

As shown in FIG. 2, layers 120, and 130-165 have been selectively etched away using ion-beam etching, leaving the upper and lower SOT-MRAM cell stacks, separated by SHE layer 145 having a bottom electrode 135 in electrical contact with a contact 115 of a device element (e.g., a transistor) of the underlying semiconductor device. As shown in the figure, In an embodiment, the lower SOT-MRAM cell stack free layer 140 has a first thickness and a first volume. The upper SOT-MRAM cell stack free layer 150 has a second thickness and second volume which differ from those of the lower SOT-MRAM cell stack free layer 140. The energy barrier associated with writing to each of the lower and upper SOT-MRAM cell stacks is directly related to the geometry and volume of the respective free layers.

The relative energy barriers to writing each of the upper and lower SOT-MRAM cells are directly proportional to the volume of the free layer of each SOT-MRAM cell, as well as the magnetic anisotropy field of the material of each layer and the magnetization of saturation of the each layer. The anisotropy field and magnetization of saturation of each layer relate to the volume of the layers as well as the respective material types of each layer. In an embodiment, the energy barrier of the free layer of the upper MRAM cell exceeds the energy barrier of the lower MRAM cell by design as the thickness and the volume of the free layer of the upper MRAM cell stack exceed the thickness and the volume of the lower MRAM cell stack. For this embodiment, the upper SOT-MRAM cell has a higher energy barrier to writing than the lower SOT-MRAM cell. In this embodiment, the lower SOT-MRAM cell may be written independently of the upper SOT-MRAM cell. In an embodiment, the upper and lower free layer thicknesses are adjusted to tailor the respective energy barriers of the upper and lower SOT-MRAM cells.

Figure 3:
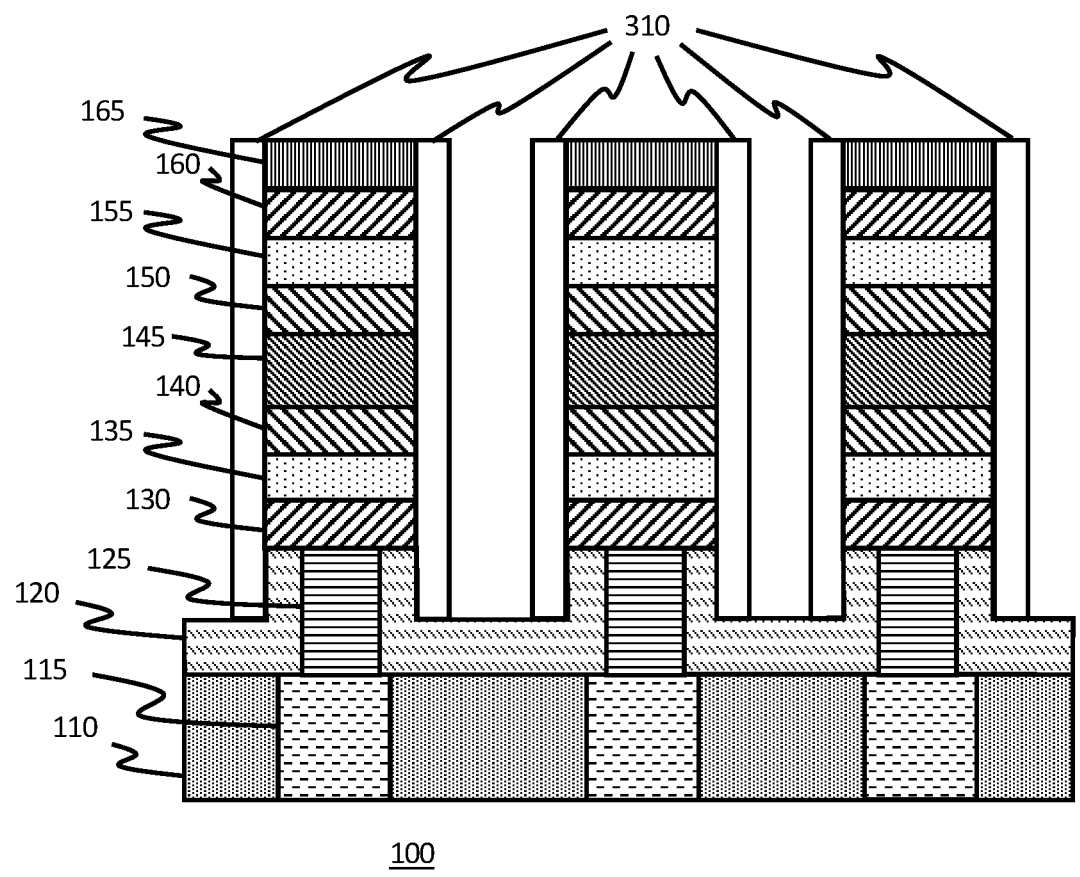
FIG. 3 provides a cross-sectional view of a step in the fabrication of a semiconductor device, according to an embodiment of the invention. The figure illustrates the encapsulation of the MRAM cell stacks with a set of first protective dielectric material sidewall spacers.

FIG. 3 provides a cross-sectional view of the device 100 at an intermediate stage of fabrication. The figure illustrates the device 100 after the addition of protective sidewalls 310 to the vertical surfaces of the MRAM cell structures. Exemplary protective sidewall 310 materials include SiN, SiCO, SiC, $SiO_2$, and similar materials. In an embodiment, sidewalls 310 are formed by conformal deposition of dielectric material, followed by anisotropic RIE of the material. Sidewall 310 materials deposited upon horizontal surfaces may be removed using anisotropic etching processes.

Figure 4:
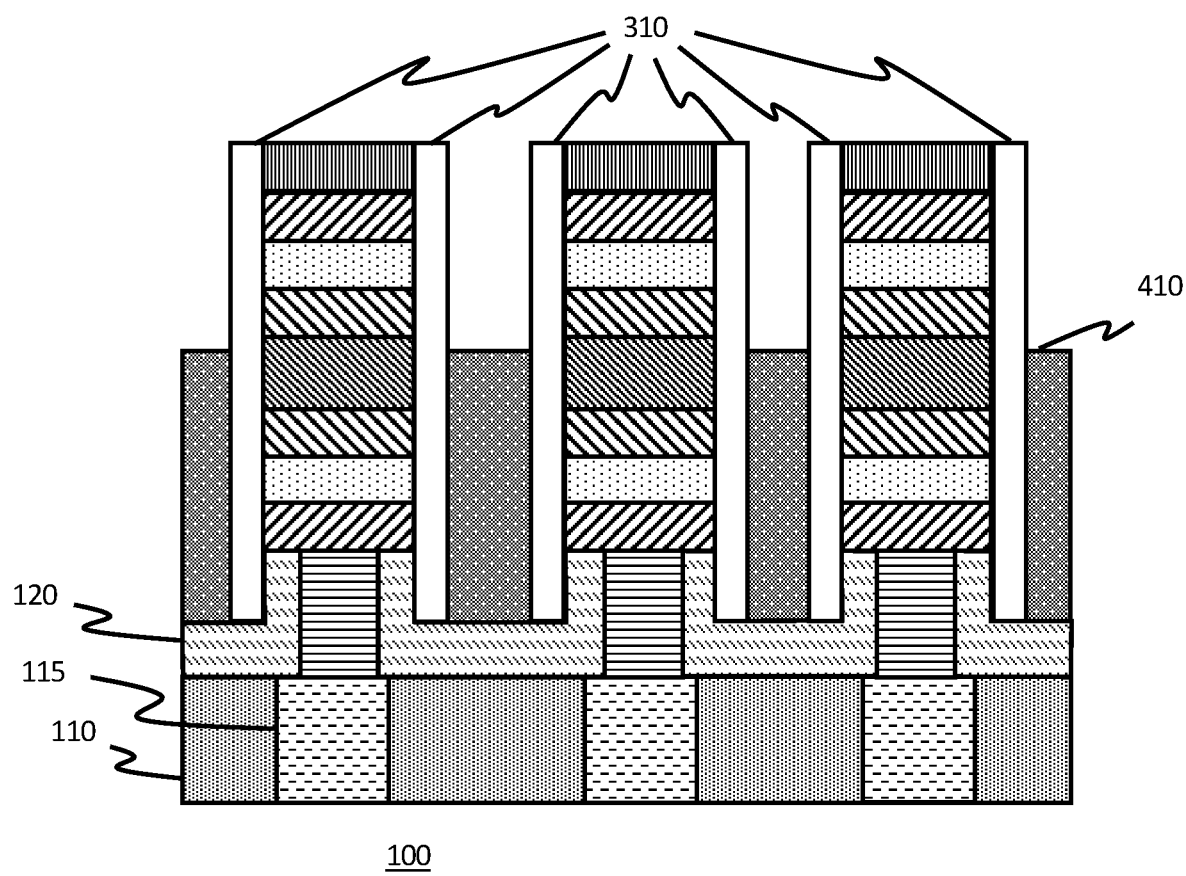
FIG. 4 provides a cross-sectional view, of a step in the fabrication of a semiconductor device, according to an embodiment of the invention. The figure illustrates the device after the addition of an interlayer dielectric (ILD) material layer.

As shown in FIG. 4, following the encapsulation of the SOT-MRAM cell stacks by sidewalls 310, an interlayer dielectric (ILD) material 410 is deposited and polished using chemical-mechanical planarization (CMP) processes. FIG. 4 illustrates the device after the deposition of the ILD 410 and the polishing by CMP processes. The upper surface of ILD layer 410 coincides with a level between the lower and upper surfaces of SHE layer 145. In an embodiment, the ILD material deposition ends above the SOT-MRAM stacks. After the CMP processes removes ILD material to a level flush with the top of the stacks, the ILD material is then selectively removed to recess the ILD layer to a point at or near the upper surface of the SHE layers of the stacks.

Figure 5:
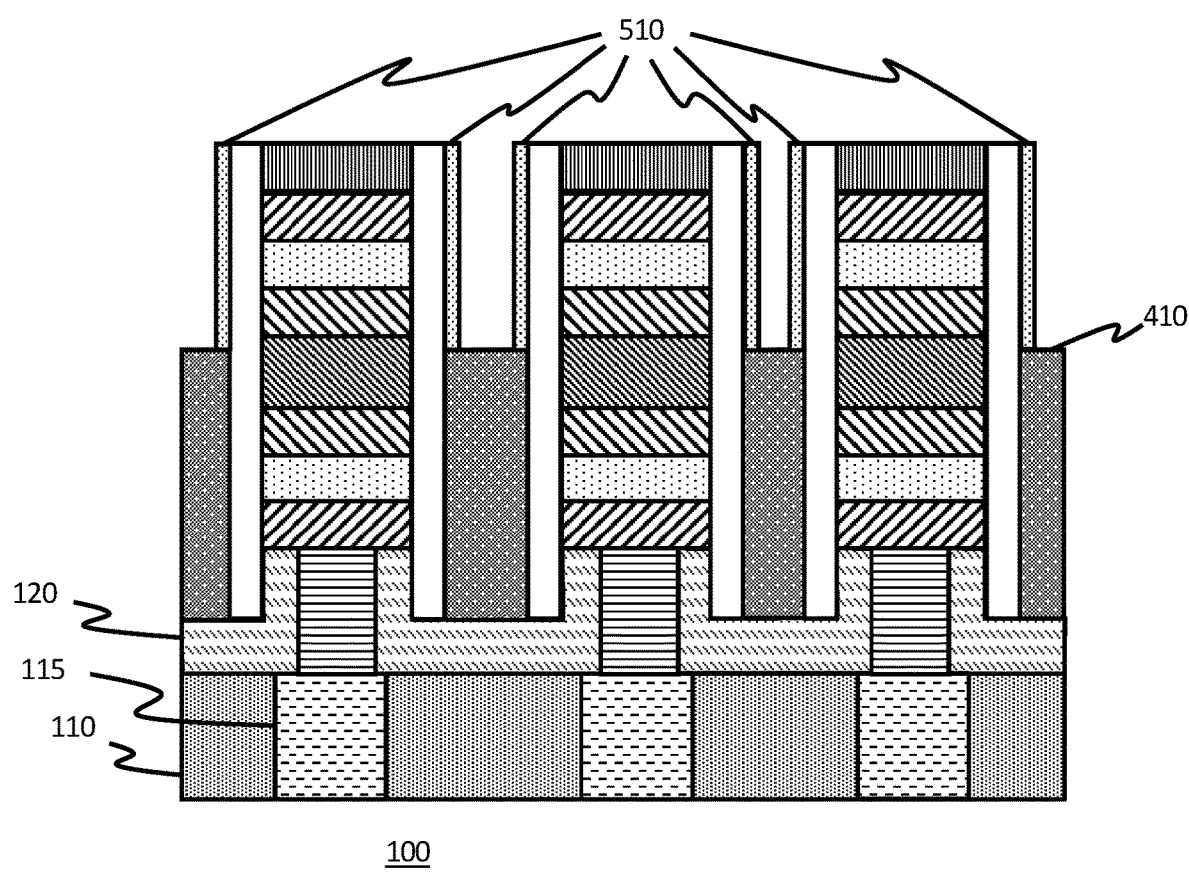
FIG. 5 provides a cross-sectional view of a step in the fabrication of a semiconductor device, according to an embodiment of the invention. The figure illustrates the device after the addition of a second dielectric sidewall spacer.

FIG. 5 illustrates the device at an intermediate fabrication stage and after the fabrication of second dielectric sidewall spacers 510. Second sidewall spacers 510 are formed by the conformal deposition and selective removal of a dielectric material leaving dielectric material 510 upon the vertical surfaces of the first sidewalls 310. In an embodiment, removal of excess material occurs using anisotropic RIE methods.

Figure 6:
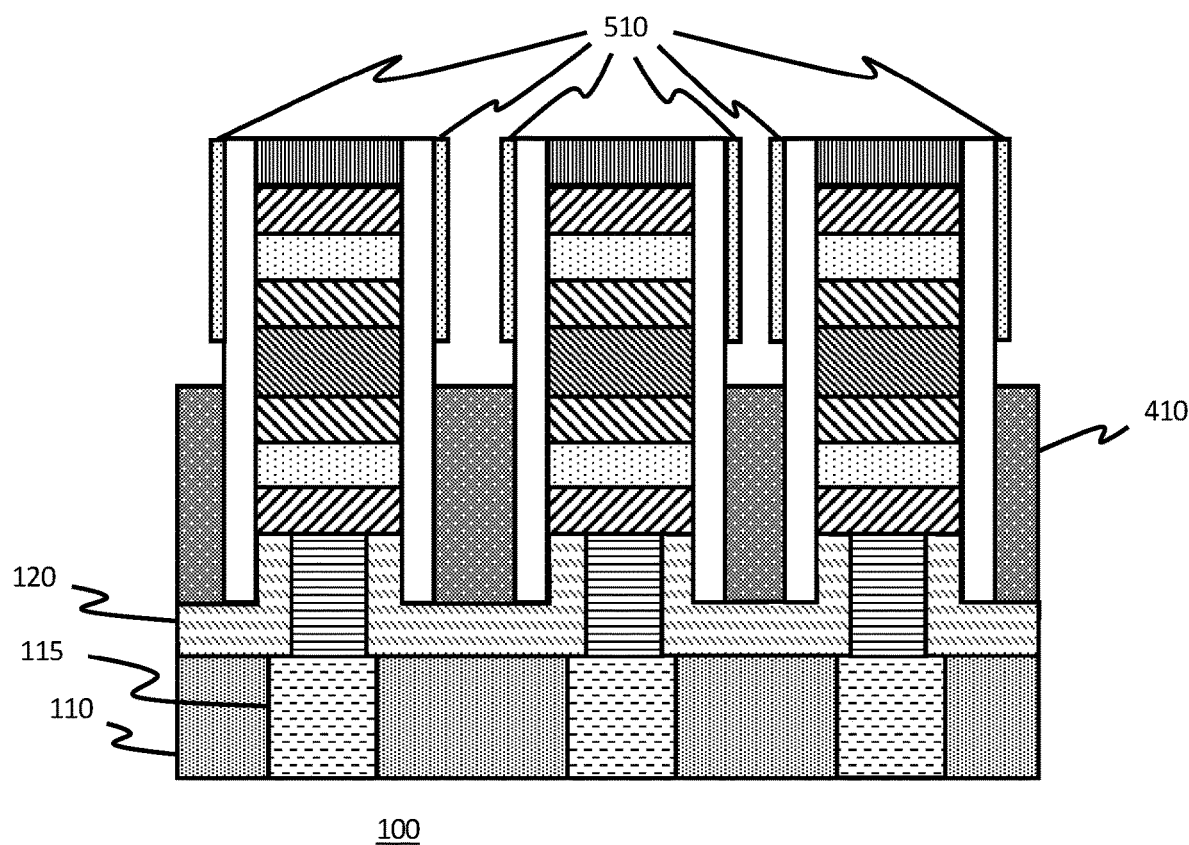
FIG. 6 provides a cross-sectional view of a step in the fabrication of a semiconductor device, according to an embodiment of the invention. The figure illustrates the device after the removal of portions of the second dielectric sidewall spacers.

FIG. 6 illustrates the device at an intermediate fabrication stage and after the selective removal of portions of ILD material 410, thereby exposing portions of dielectric sidewalls 310. ILD material 410 portions may be removed using anisotropic etching or other known methods. The removal of portions of the ILD 410, exposes portions of sidewalls 310 corresponding to regions between the lower and upper surfaces of SHE layers 145.

Figure 7:
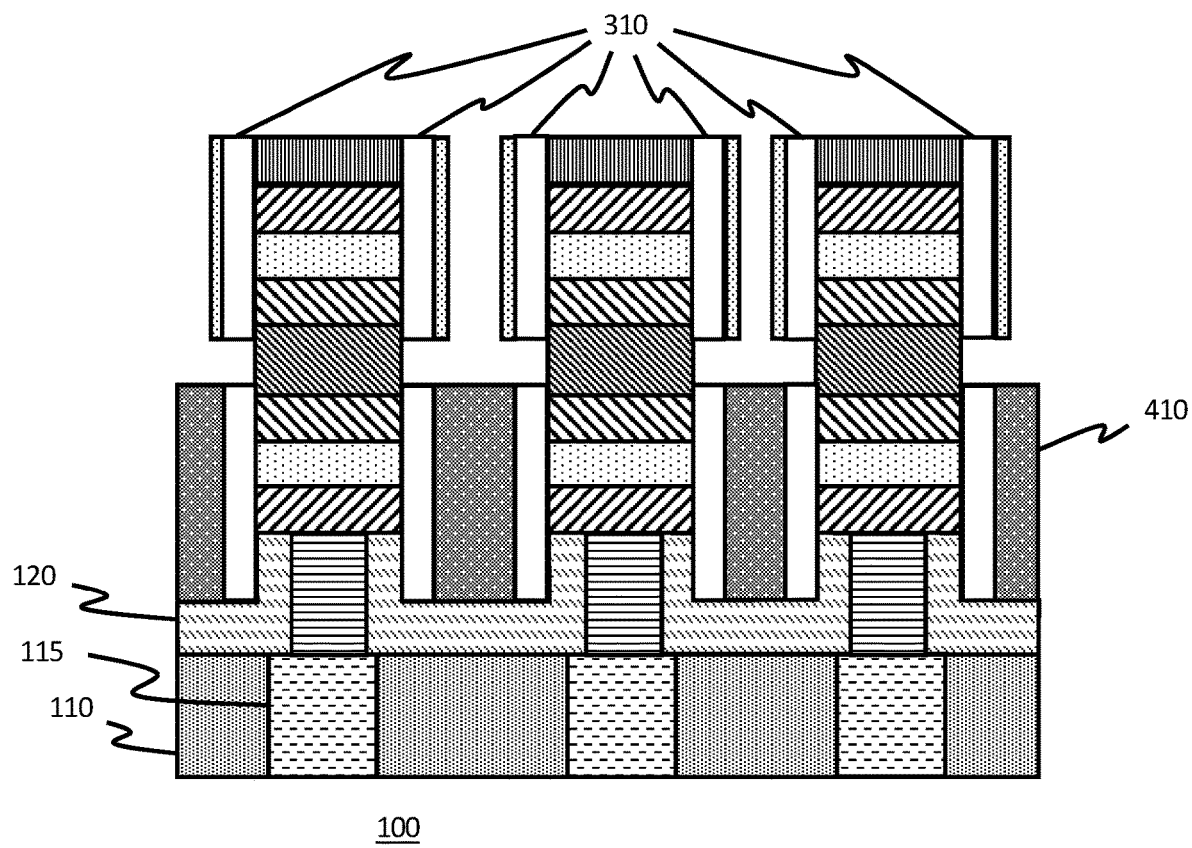
FIG. 7 provides a cross-sectional view of a step in the fabrication of a semiconductor device, according to an embodiment of the invention. The figure illustrates the device after the masking and selective etching of the first dielectric sidewall spacers, exposing spin-Hall-Effect (SHE) layers 145 of the MRAM cell stacks.

FIG. 7 illustrates device 100 at an intermediate fabrication stage and after the selective removal of portions of dielectric sidewalls 310, thereby exposing portions of SHE layers 145. Dielectric sidewall 310 portions may be removed using isotropic etching or other known methods. The removal of portions of sidewalls 310 exposes vertical portions of SHE layers 145 corresponding to regions between the lower and upper surfaces of SHE layers 145.

Figure 8:
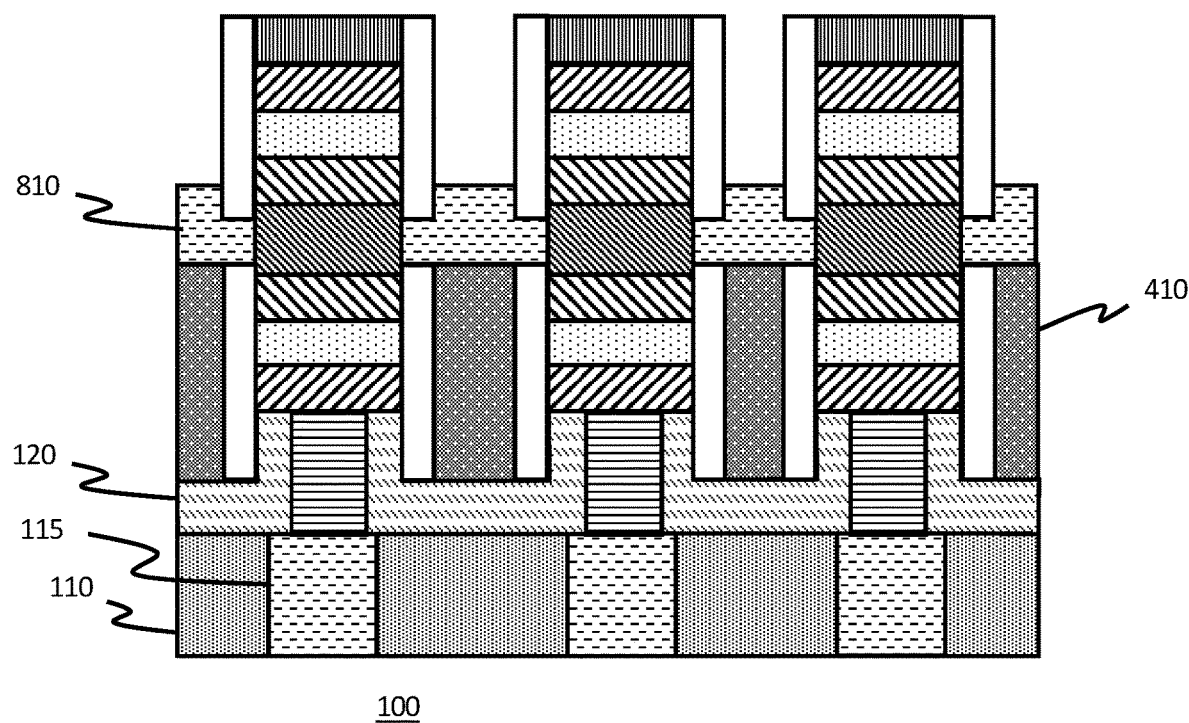
FIG. 8 provides a cross-sectional view of a step in the fabrication of a semiconductor device, according to an embodiment of the invention. The figure illustrates the device after the removal of the remaining portions of the second dielectric sidewalls and deposition of low resistivity material between adjacent MRAM cell stacks. The low resistivity material is electrically connected to the SHE material layers of the adjacent MRAM cell stacks. The deposition of the conductive material forms a common SHE rail between the MRAM cell stacks FIG. 9 provides a cross-sectional view of a step in the fabrication of a semiconductor device, according to an embodiment of the invention. The figure illustrates the device after the addition of an interlayer dielectric material and the addition of an upper metal contact for each MRAM cell stack.

FIG. 8 illustrates device 100 at an intermediate stage of fabrication. As shown in the Figure, the remaining portions of secondary dielectric sidewalls 510 have been selectively removed by etching, and secondary SHE layer material 810 has been deposited between adjacent SOT-MRAM cell stacks, connecting adjacent SOT-MRAM cell stack SHE layers 145.

Deposition of secondary SHE layer material 810 occurs as set forth above for SHE layer 145. In an embodiment, secondary SHE layer material 810 is deposited upon the SOT-MRAM cell stacks and exposed ILD material layer 410. Secondary SHE material 810 covers SOT-MRAM cell stacks. CMP processes reduce the layer of material 810 to a point flush with the tops of the SOT-MRAM cell stacks. A controlled recess of the material 810 layer using isotropic etching, anisotropic etching, or a combination of those methods, recesses the height of the layer of material 810 to a level at or near the upper surface of the SHE layers of the stacks. Masking and selective etching of the recessed layer of material 810 yields contiguous rows of SOT-MRAM cell stacks, each contiguous row connected by a common composite SHE write rail, rather than the entire array of stacked SOT-MRAM cell stacks connected by a single plane of connected SHE layers. Secondary SHE layer material 810 need not exhibit SHE properties as this portion of the SHE rail is not disposed adjacent to the free layers of the vertical MRAM cell stacks. Exemplary materials for secondary SHE layer material 810 include Cu, Ru, Co, and other similarly low resistivity metallic elements and alloys. Deposition, recessing, masking, and selective removal of the secondary SHE layer material 810 may be followed by appropriate CMP processes.

Figure 9:
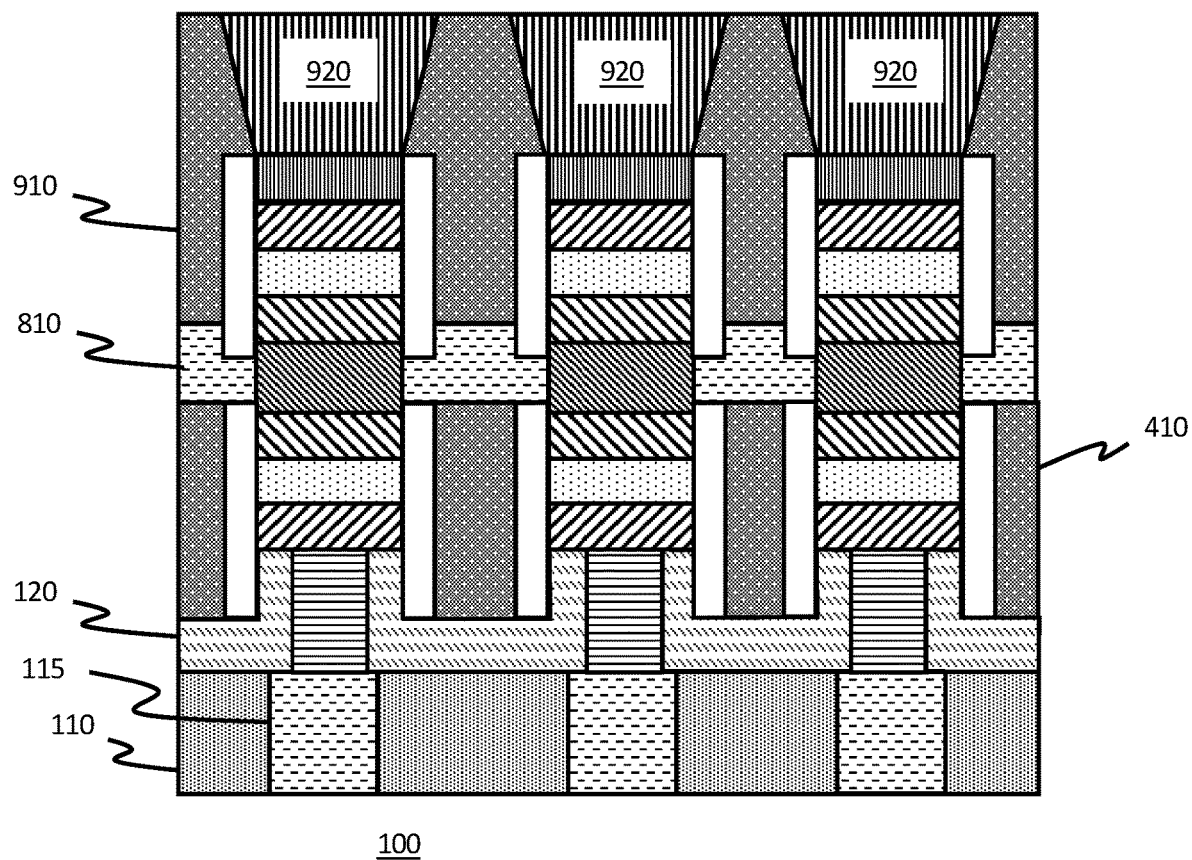

FIG. 9 illustrates device 100 following final process fabrication stages to deposit and polish an upper ILD layer 910 upon the secondary SHE layer material 810. After the deposition and CMP of ILD 910, contact vias are etched through ILD 910, exposing a surface of the upper contact electrode layers 165. The contact vias are then filled with a conductive metal 920, using any of the deposition method described herein. In an embodiment, conductive metal 920 includes any of Cu, Ru, Co, W, Ti, TiN, deposited using CVD, PVD, or plating processes. In an embodiment, the conductive metal layer has a thickness of between about 30 nm and about 70 nm. RIE processes may be used to create the contact vias. CMP processes are then applied to create a polished upper surface for the back-end-of-line processes needed to complete and package the final semiconductor device.

Figure 10:
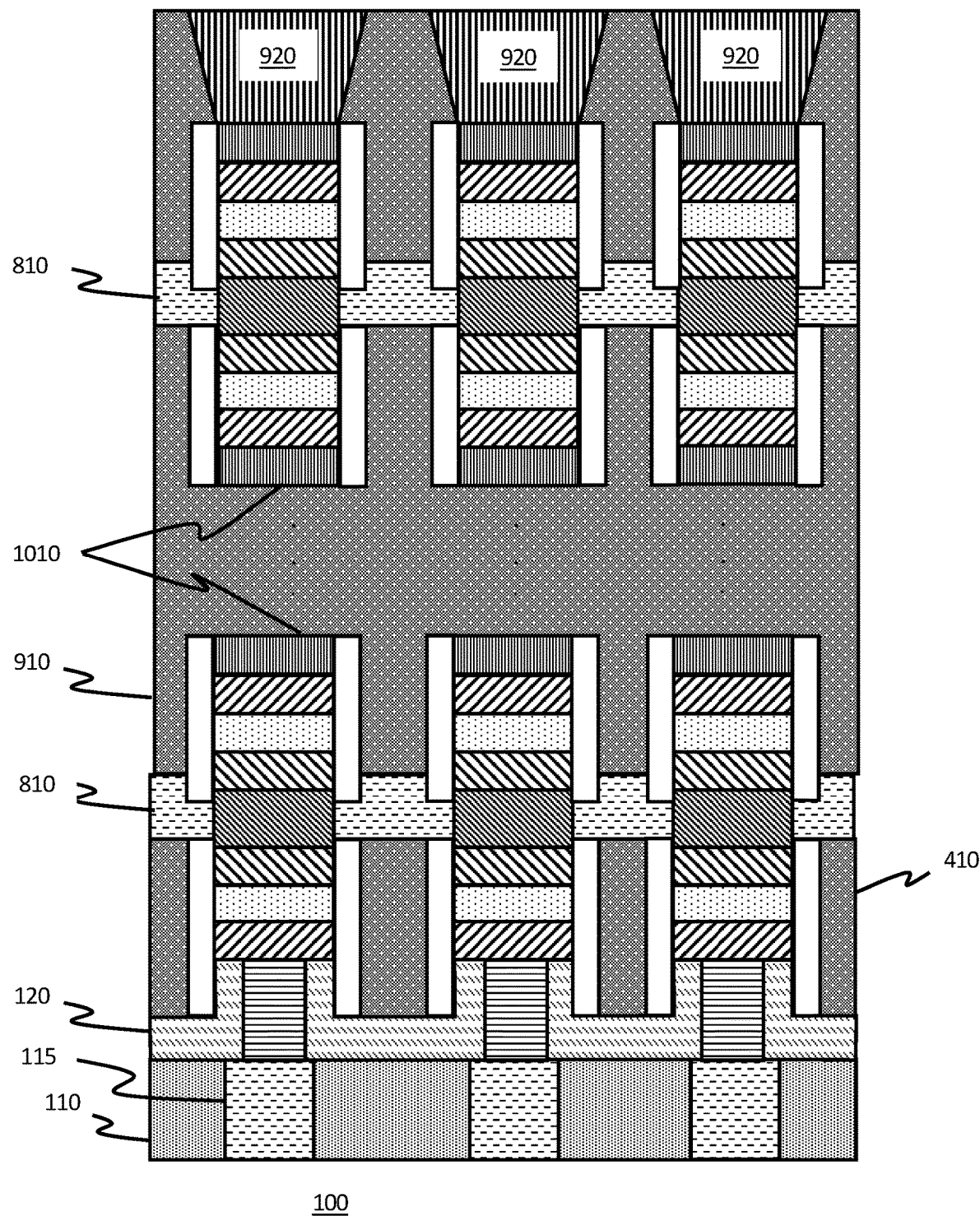
FIG. 10 provides a cross-sectional view of a step in the fabrication of a semiconductor device, according to an embodiment of the invention. In this embodiment, each MRAM cell stack includes multiple sets of MRAM cells separated by common SHE rails. The figure illustrates the device after the addition of an interlayer dielectric material and the addition of an upper metal contact for each MRAM cell stack.

FIG. 10 illustrates an embodiment of device 100 wherein each SOT-MRAM cell stack includes multiple combinations of upper and lower SOT-MRAM cells separated by SHE rails formed of SHE layers 145 and secondary SHE materials 810. Each pair of lower and upper SOT-MRAM cell stacks includes SHE write rails separating the lower and upper SOT-MRAM cells of the pair. The lower-upper SOT-MRAM cells—SHE rail combinations of each stack of multiple combinations are separated by a low resistivity metallic spacing layer 1010 deposited during the deposition of the multiple layers of final stack configuration, prior to etching of the individual stacks. After stack etching, SHE rails for rows of adjacent SOT-MRAM cell pairs are formed through iterations of the steps associated with FIGS. 4-8, for each successive layer of SOT-MRAM cells of the stacks of cells.

Figure 11:
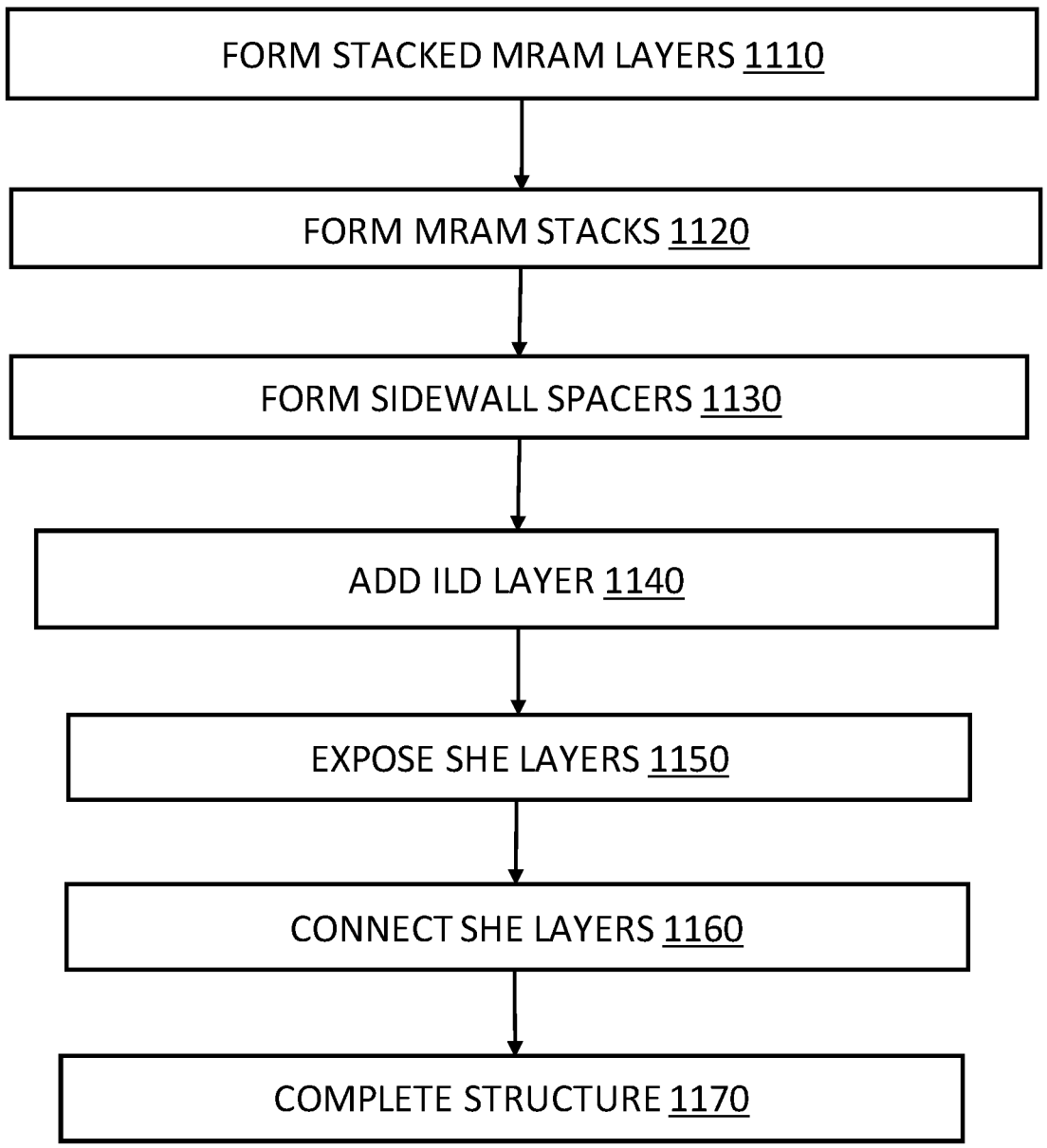
FIG. 11 provides a flowchart depicting operational steps for forming semiconductor device, according to an embodiment of the invention.

FIG. 11 provides a flowchart depicting operational steps associated with the fabrication of the disclosed SOT-MRAM devices. According to the figure, at block 1110, a series of layers are formed upon an underlying semiconductor device. The underlying semiconductor device includes a set of bottom electrodes in contact with transistors intended for the control of SOT-MRAM devices. The series of layers includes a lower reference layer, a lower tunnel junction layer, a lower free layer, an SHE layer, an upper free layer, and upper tunnel junction layer, an upper reference layer and an upper electrode layer. Each layer is formed across the entire cross section of the device.

At block 1120, the series of layers is masked and selectively etched back leaving the SOT-MRAM cell stacks, each stack in electrical contact with a lower electrode. The final lower SOT-MRAM stacks are disposed above and in electrical contact with a metal contact of a read transistor of the underlying semiconductor device by way of the lower electrode. The etching yields an array of multiple SOT-MRAM cell stacks. Each stack including at least a pair of SOT-MRAM cells separated by an SHE layer. The SHE layer comprises a high-density conductive material having good spin-Hall-Effect properties capable of altering the spin of materials in adjacent free layers of the upper and lower SOT-MRAM cell stacks.

At block 1130, the formed SOT-MRAM cell stacks are then encapsulated by a first dielectric material protective sidewall. The first dielectric material protective sidewall is etched back exposing the upper surface of the upper electrode layer of the SOT-MRAM cell stacks and the horizontal surface of the lower ILD material of the device.

At block 1140, an interlayer dielectric material is deposited over the device and a CMP process polishes the upper surface of the ILD material. The upper surface of the ILD layer corresponds to a level between the lower and upper surfaces of the SHE layers of the SOT-MRAM cell stacks.

At block 1150, the SHE layers of the SOT-MRAM cell stacks are exposed. A second dielectric sidewall is deposited above the ILD layer and in contact with the first dielectric sidewall. sidewall-image transfer processes or a combination of deposition and etching processes are used to form the second dielectric sidewalls. The ILD layer is selectively etched to a height at or above the lower surface of the SHE layers of the vertical MRAM cell stacks. exposing portions of the first dielectric sidewalls corresponding to the SHE layers of the SOT-MRAM cell stacks. The exposed portions of the first dielectric sidewalls are then selectively etched, exposing portions of the SHE layers of the SOT-MRAM cell stacks.

At block 1160, the exposed portions of the SHE layers of adjacent stacked SOT-MRAM cells are electrically connected by the deposition of a conductive secondary SHE layer material, forming SHE write rails connecting rows of adjacent SOT-MRAM cell stacks. The SHE write rail is further disposed in electrical contact with a write transistor of the underlying semiconductor device (not shown).

The relative energy barriers to writing each of the upper and lower SOT-MRAM cells are directly proportional to the volume of the free layer of each SOT-MRAM cell, as well as the magnetic anisotropy field of the material of each layer and the magnetization of saturation of the each layer. The anisotropy field and magnetization of saturation of each layer relate to the volume of the layers as well as the respective material types of each layer. The combination of horizontal cross-section and layer thickness of the two layers can be manipulated in the device design to tailor the absolute magnitude of the respective energy barriers as well as the relative magnitude of the two energy barriers. In an embodiment, the thickness of the upper free layer is greater than the thickness of the lower free layer and the corresponding upper energy barrier is greater than the thickness of the lower energy barrier enabling each of the two SOT-MRAM cells to be written by the application of a distinct write energy by way of the SHE.

After the SHE write rail for rows of adjacent SOT-MRAM cell stacks are formed, an encapsulating interlayer dielectric material is disposed over the stacks and SHE rails. A CMP process is performed to trim and polish the upper surface of the device in preparation for further device fabrication steps, including the etching of vias and the deposition of upper contacts connected to the upper electrode layers of the SOT-MRAM cell stacks. At block 1170, the upper contact for the upper SOT-MRAM cell is formed. A via is etched in the ILD and filled with a conductive gate metal material. The metal gate can include any known metal gate material known to one skilled in the art, e.g., tantalum (Ta), tungsten (W), ruthenium (Ru), titanium nitride (TiN), and tantalum nitride (TaN). A CMP process trims and polishes the upper surface of the device in preparation for further back-end-of-line processes.

Figure 12:
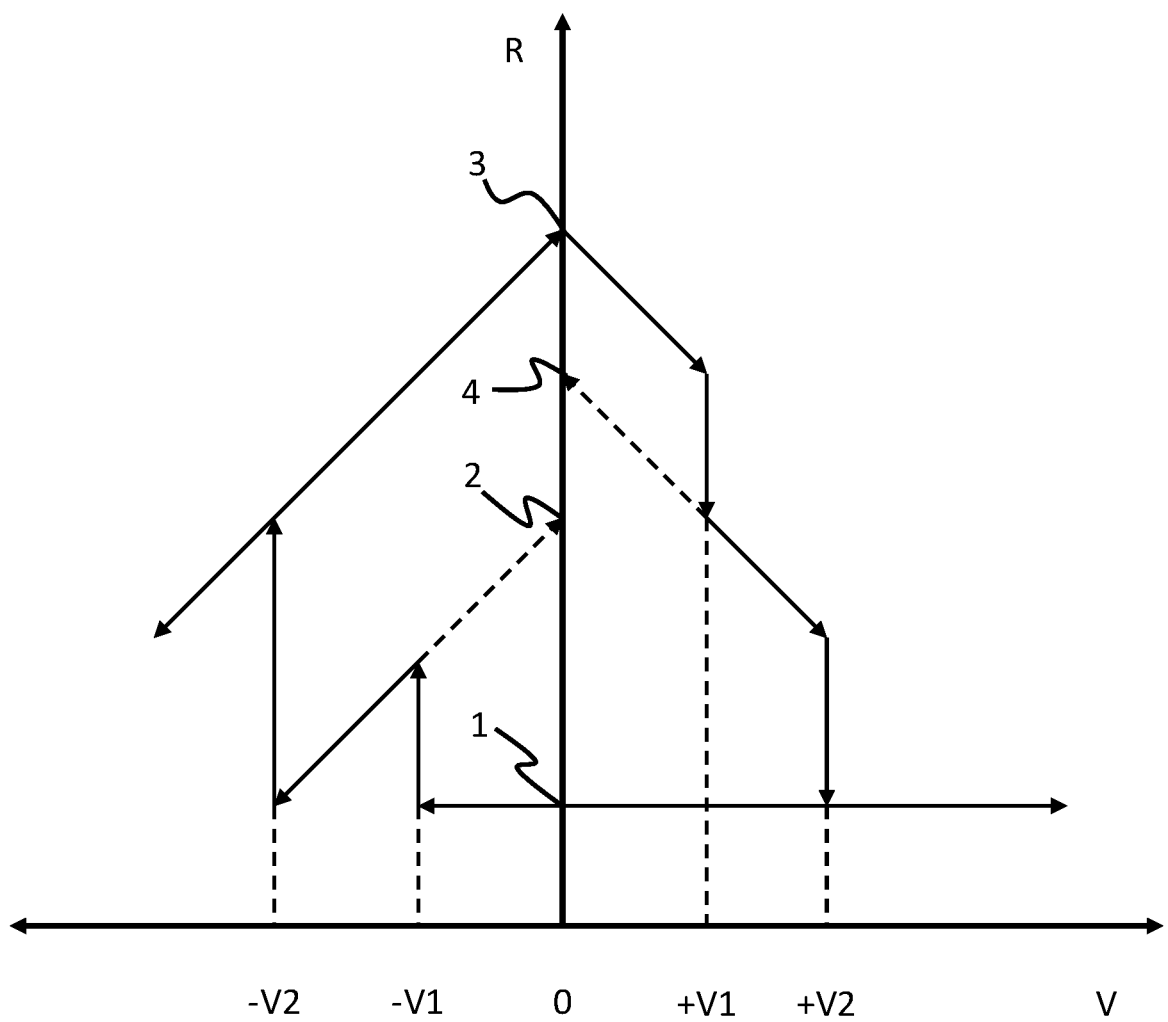
FIG. 12 depicts a relationship between applied SHE rail write voltages and overall stacked SOT-MRAM cell device resistance, according to an embodiment of the invention.

Stacked SOT-MRAM cells including an upper (U) MRAM cell and a lower (L) MRAM cell, provide four unique device resistance state for each pair of stacked cells. Those four states relate to U-P, L-P; U-AP, L-P; U-P, L-AP; and U-AP, L-AP resistance states. FIG. 12 depicts a graph of applied SHE rail write voltage and stacked SOT-MRAM cell resistance. As shown in FIG. 12, for a device initially residing at the U-P, L-P state, and having a resistance corresponding to point 1 of the Figure, application of a negative write voltage (−V1) exceeding the P-AP transition voltage of the upper MRAM cell across an SHE rail between stacked SOT-MRAM cells, results in a state change from the parallel (P) state of a first (upper) cell to the anti-parallel (AP) state for that cell. This state change shifts the overall resistance of the stacked cells at an applied SHE write voltage of zero from U-P, L-P, point 1 of the Figure, to point 2, the U-AP, L-P state resistance. Further increasing the negative write voltage across the common SHE rail to exceed the P-AP transition threshold (−V2) for the lower MRAM cell, shifts the lower MRAM cell from the P to AP state, yielding an overall resistance of U-AP, L-AP, corresponding to a resistance corresponding to point 3 at an applied write voltage of zero.

Application of a positive write voltage to the U-AP, L-AP state of the stack exceeding the AP-P transition threshold (+V1) of the upper MRAM cell results in a state transition for the upper MRAM cell resulting in the overall resistance corresponding to point 4 for the U-P, L-AP state of the device at an applied write voltage of zero. Further increasing the applied SHE rail positive voltage past the AP-P transition threshold voltage (+V2) of the lower MRAM cell returns the device to the U-P, L-P, state and the associated resistance of point 1 of the Figure corresponding to an applied voltage of zero.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An MRAM (magnetoresistive random-access memory) structure comprising:
   a plurality of stacks of MRAM cells, each stack of MRAM cells comprising:
      a first vertical MRAM cell stack, the first vertical MRAM cell stack disposed upon a first bottom electrode,
      a first metal layer disposed above and in electrical contact with the first vertical MRAM cell stack;
      a second vertical MRAM cell stack, the second vertical MRAM cell stack disposed above and in electrical contact with the first metal layer; and
      a second metal layer disposed between adjacent stacks of MRAM cells and in electrical contact with the first metal layers of the adjacent stacks of MRAM cells.

2. The MRAM structure according to claim 1, further comprising a plurality of stacks of MRAM cell stacks, the plurality electrically connected via a common spin hall effect (SHE) rail, the SHE rail comprising the first metal layer and the second metal layer.

3. The MRAM structure according to claim 1, wherein the first vertical MRAM stack has a first write energy barrier and the second vertical MRAM stack has a second write energy barrier; wherein the first write energy barrier is different than the second write energy barrier.

4. The MRAM structure according to claim 1, wherein the first metal layer has a first resistivity, the second metal layer has a second resistivity, and wherein the first resistivity exceeds the second resistivity.

5. The MRAM structure according to claim 1, wherein the first metal layer is a heavy metal/alloy having strong spin-orbit interaction and exhibits spin Hall effect (SHE) properties.

6. The MRAM structure according to claim 1, wherein each stack of MRAM cells further comprises:
   a third vertical MRAM cell stack, the third vertical MRAM cell stack disposed above and in vertical alignment with the second vertical MRAM cell stack,
   a third metal layer disposed above and in electrical contact with the third vertical MRAM cell stack;
   a fourth vertical MRAM cell stack, the fourth vertical MRAM cell stack disposed above and in electrical contact with the third metal layer; and
   a fourth metal layer disposed between adjacent stacks of MRAM cells and in electrical contact with the third metal layers of adjacent stacks of MRAM cells.

7. The MRAM structure according to claim 1, wherein a free layer of the first MRAM stack is disposed adjacent to the first metal layer.

8. A magnetoresistive random-access memory (MRAM) structure comprising:
   a plurality of stacks of MRAM cells, each stack of MRAM cells comprising:
      a first vertical MRAM cell stack, the first vertical MRAM cell stack disposed upon a first bottom electrode, the first vertical MRAM stack disposed in electrical communication with a transistor;
      a first metal layer disposed above and in electrical contact with the first vertical MRAM cell stack;
      a second vertical MRAM cell stack, the second vertical MRAM cell stack disposed above and in electrical contact with the first metal layer; and a second metal layer disposed between adjacent stacks of MRAM cells and in electrical contact with the first metal layers of the adjacent stacks of MRAM cells.

9. The MRAM structure according to claim 8, further comprising a plurality of stacks of MRAM cell stacks, the plurality electrically connected via a common spin hall effect (SHE) rail, the SHE rail comprising the first metal layer and the second metal layer.

10. The MRAM structure according to claim 8, wherein the first vertical MRAM stack has a first write energy barrier and the second vertical MRAM stack has a second write energy barrier; wherein the first write energy barrier is different than the second write energy barrier.

11. The MRAM structure according to claim 8, wherein the first metal layer has a first resistivity, the second metal layer has a second resistivity, and wherein the first resistivity exceeds the second resistivity.

12. The MRAM structure according to claim 8, wherein the first metal layer is a heavy metal/alloy where the spin-orbit interaction is strong and exhibits spin Hall effect (SHE) properties.

13. The MRAM structure according to claim 8, wherein each stack of MRAM cells further comprises:
- a third vertical MRAM cell stack, the third vertical MRAM cell stack disposed above and in vertical alignment with the second vertical MRAM cell stack,
- a third metal layer disposed above and in electrical contact with the third vertical MRAM cell stack;
- a fourth vertical MRAM cell stack, the fourth vertical MRAM cell stack disposed above and in electrical contact with the third metal layer; and
- a fourth metal layer disposed between adjacent stacks of MRAM cells and in electrical contact with the third metal layers of adjacent stacks of MRAM cells.

14. The MRAM structure according to claim 8, wherein a free layer of the first MRAM stack is disposed adjacent to the first metal layer.

* * * * *